United States Patent [19]
Cuevas

[11] Patent Number: 5,097,449
[45] Date of Patent: Mar. 17, 1992

[54] NON-VOLATILE MEMORY STRUCTURE

[75] Inventor: Yongbum P. Cuevas, San Jose, Calif.

[73] Assignee: VLSI Technology, Inc., San Jose, Calif.

[21] Appl. No.: 494,007

[22] Filed: Mar. 15, 1990

[51] Int. Cl.$^5$ .............................................. G11C 13/00
[52] U.S. Cl. ..................................... 365/228; 361/154; 361/185
[58] Field of Search .................. 365/154, 185, 189.01, 365/230.01, 189.05, 230.08, 228

[56] References Cited

U.S. PATENT DOCUMENTS

| | | | |
|---|---|---|---|
| 4,132,904 | 1/1979 | Harari | 307/238 |
| 4,203,158 | 5/1980 | Frohman-Bentchkowsky et al. | 365/185 |
| 4,274,012 | 6/1981 | Simko | 307/238.3 |
| 4,477,825 | 10/1984 | Yaron et al. | 357/23.5 |
| 4,513,397 | 4/1985 | Ipri et al. | 365/185 |
| 4,527,255 | 7/1985 | Keshtbod | 365/154 |
| 4,527,259 | 7/1985 | Watanabe | 365/189 |
| 4,571,704 | 2/1986 | Bohac, Jr. | 365/156 |
| 4,571,705 | 2/1986 | Wada | 365/195 |
| 4,611,309 | 9/1986 | Chuang et al. | 365/185 |
| 4,685,083 | 8/1987 | Leuschner | 365/185 |

Primary Examiner—Terrell W. Fears
Attorney, Agent, or Firm—Burns, Doane, Swecker & Mathis

[57] ABSTRACT

A non-volatile memory circuit for use with an E$^2$-PROM includes redundant, parallel connected, floating node MOSFET memory cells for storing complementary information. The non-volatile memory cells are connected in parallel to a volatile memory circuit via a voltage level shifter circuit for writing operations, and via twin mixed PMOS and NMOS transistors for reading operations. With the combined complementary non-volatile memory cells and the twin mixed pairs of transistors, the stored information is retained in the event that one of the memory cells fails.

9 Claims, 2 Drawing Sheets

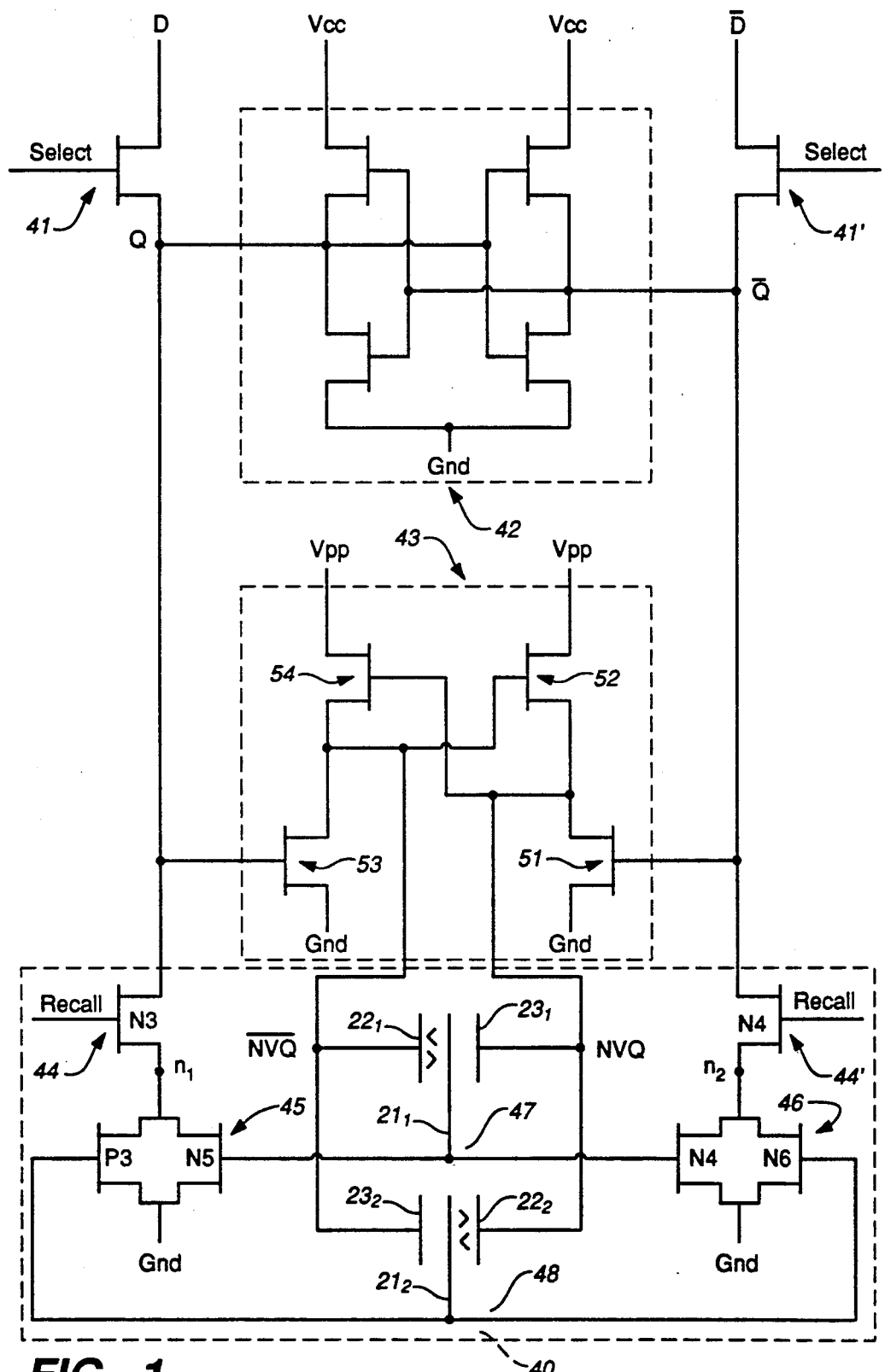
FIG._1

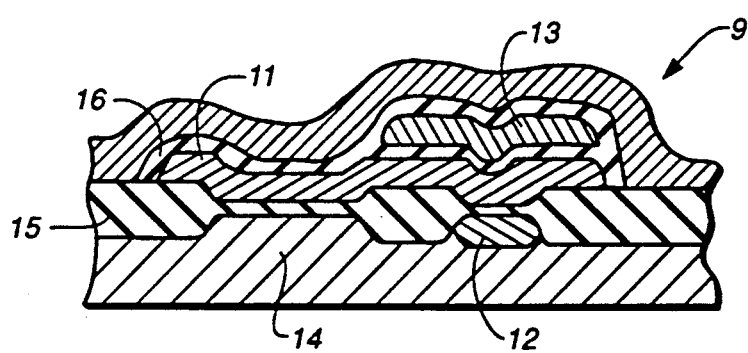
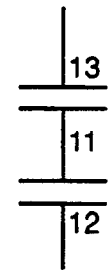
FIG._2　　　FIG._2A

NON-VOLATILE MEMORY STRUCTURE

BACKGROUND OF THE INVENTION

1. Field of the Invention

The present invention generally relates to memory structures and, more particularly, to memory structures for use in E²PROMs (Electrically Erasable Programmable Read Only Memories).

2. Description of Related Art

In the microelectronic arts, memory devices can be broadly characterized as either random access memories (RAMs) or read-only memories (ROMs). RAMs can be described as read/write memory devices whose contents may be altered at will and which can be randomly addressed by a two-dimensional addressing scheme (e.g., select and data lines). Also, RAMs have the characteristic of being volatile; that is, all information stored in a RAM is lost when power is removed. By way of contrast, ROMs have the characteristic of being non-volatile; that is, information stored in a ROM is not lost when power is removed.

Two examples of ROMs are electrically programmable ROMs (EPROMs) and electrically erasable PROMs (EEPROMs or E²PROMs). EPROMs have the characteristic that they are field programmable. Data is written into EPROMs electrically, but a strong source of ultraviolet (UV) light is required to erase data. Typically, erasure of an EPROM requires removing it from its host circuit board. E²PROMs are characterized by the fact that they do not require an ultraviolet light source for erasure and, consequently, do not need to be removed from a host circuit board for reprogramming. Typically, EPROMs and E²PROMs are based upon metal-oxide-semiconductor field effect transistor (MOSFET) technology.

SUMMARY OF THE INVENTION

The present invention generally provides E²PROM memory circuits having redundant non-volatile memory cells that are accessed by transistor circuits. More particularly, the present invention provides non-volatile memory circuit for use with E²PROMs including a redundant, parallel connected, floating node MOSFET memory cells for storing complementary information. The non-volatile memory cells are connected in parallel to a volatile memory circuit via a voltage level shifter circuit for writing operations, and via twin mixed PMOS and NMOS transistors for reading operations. Due to the arrangement of the complementary non-volatile memory cells and the twin mixed pairs of transistors, stored information is retained in the event that one of the memory cells fails.

BRIEF DESCRIPTION OF THE DRAWINGS

The present invention can be further understood by reference to the following description and appended drawings which illustrate the preferred embodiment of the invention. In the drawings:

FIG. 1 is a schematic diagram of an E²PROM memory circuit according to the present invention; and FIG. 2 is a cross-sectional view of a double-layer polysilicon memory cell of the floating node type.

FIG. 2A is a schematic of FIG. 2.

DETAILED DESCRIPTION OF THE PREFERRED EMBODIMENT

Generally speaking, FIG. 1 shows an E²PROM memory circuit that includes a redundant non-volatile memory which is accessed by transistor circuits More particularly, the E²PROM memory circuit comprises three basic circuit sections: a volatile memory circuit 42, a voltage level shifter circuit 43, and a non-volatile memory circuit 40. As will be described further below, the non-volatile memory circuit includes parallel non-volatile memory cells 47 and 48, and twin mixed pairs of NMOS and PMOS transistors 45 and 46, respectively, for safeguarding against loss of information from volatile memory circuit 42 in the event of a power failure. More particularly, memory cells 47 and 48 in the non-volatile memory circuit 40 are not altered by normal (i.e., low) voltages, but can be either written or erased by higher voltages.

In the illustrated embodiment, volatile memory circuit 42 comprises a bistable flip-flop. As such, information that is stored in the circuit can be read at nodes Q and $\bar{Q}$. As the symbols imply, the state of node Q is the binary complement of the state of node $\bar{Q}$. For example, if node Q is at a binary level 1, then node $\bar{Q}$ is at the binary level of 0.

In operation of volatile memory circuit 42 of FIG. 1, data is written to, or read from, nodes Q and $\bar{Q}$ over bi-directional data lines D and $\bar{D}$, respectively. In the illustrated embodiment, reading or writing is accomplished by actuating transistors 41 and 41', respectively, via the SELECT lines.

The voltage level shifter circuit 43 of FIG. 1 is comprised of cross-connected transistors 51–54. The pairs of the transistors 51–52 and 53–54 are connected in series between ground and a source $V_{pp}$ of constant voltage. Further in the voltage level shifter circuit, the drain of transistor 51 is connected to control the gate of transistor 54 and, similarly, the drain of transistor 53 is connected to control the gate of transistor 52. It should be understood that source $V_{pp}$ is set to zero volts except when the non-volatile cells in the circuit are to be programmed; during programming, source $V_{pp}$ is set to a relatively high constant voltage, such as +15 volts. When $V_{pp}$ is set to zero volts, the voltage level shifter circuit is effectively disabled.

In operation of the voltage level shifter circuit of FIG. 1, transistors 51 and 53 are controlled by the binary logic levels at nodes Q and $\bar{Q}$. More specifically, transistor 51 is conductive if the logic level at node $\bar{Q}$ is high, and is non-conductive if the logic level of that node is low. Similarly, transistor 53 is conductive if the logic level at node Q is high, and is non-conductive if the logic level of that node is low. It should be noted that the drain of transistor 51 is connected to a node NVQ in non-volatile memory circuit 40, and that the drain of transistor 53 is connected to a node $\overline{NVQ}$ in the same circuit. It should also be noted that nodes NVQ and $\overline{NVQ}$ are binary complements of one another.

Operation of voltage level shifter circuit 43 of FIG. 1 will now be explained. For writing (i.e., programming) of non-volatile circuit 40, the voltage level shifter circuit shifts the voltage level at node NVQ high (i.e., to level $V_{pp}$) if the input at node Q is a binary 1, but leaves the voltage at node NVQ at binary 0 if the voltage at node Q is a binary 0. Because the state of node $\overline{NVQ}$ is the binary complement of the state of node NVQ, the voltage $V_{pp}$ appears at node $\overline{NVQ}$ if the logic level at node Q is a binary 0, but the voltage at node $\overline{NVQ}$ is left at binary 0 if the logic level at node Q is a binary 1. Thus, the voltages at nodes NVQ and $\overline{NVQ}$ display complimentary levels that are shifted by the binary values at nodes Q and $\overline{Q}$. Those voltages can be called elevated logic levels because they reflect the voltages at nodes Q and $\overline{Q}$ but at a higher level (i.e., at voltage $V_{pp}$).

In the non-volatile memory circuit 40 in FIG. 1, memory cells 47 and 48 are connected so that if one of the nodes NVQ or $\overline{NVQ}$ is at voltage level $V_{pp}$, then voltage $V_{pp}$ is applied to an associated tunneling node (i.e., tunneling node $22_1$ or $22_2$) and the complementary elevated logic value is applied to a coupling node (i.e., coupling node $23_1$ or $23_2$). Thus, between memory cells 47 and 48, the tunneling nodes $22_1$ and $22_2$ have opposite orientations. This allows one of the non-volatile memory cells to be charged (i.e., written) while the other is discharged (i.e., erased).

In operation of the non-volatile memory circuit 40 in FIG. 1, while one of the cells 47 or 48 is being written into, the other is being erased. The net result of such action is that complimentary data is stored in the two cells. For the arrangement to be of practical value, however, a means must be included to ultimately decode the desired output information. For that reason, the non-volatile memory circuit includes twin mixed pairs of PMOS and NMOS transistors 45 and 46, and recall transistors 44 and 44'.

Generally speaking, in the non-volatile memory circuit of FIG. 1, the transistor pairs 45 and 46 are connected in parallel by their current path electrodes (i.e., source to source, drain to drain). More particularly, the gate of PMOS transistor P3 is coupled to the floating node $21_2$ of memory cell 48. Also, the gate of NMOS transistor N5 is coupled to the floating node $21_1$ of memory cell 47. Similarly, the gate of PMOS transistor P4 is coupled to floating node $21_1$ of memory cell 47, and the gate of NMOS transistor N6 is coupled to floating node $21_2$ of memory cell 48.

Further in operation of the non-volatile memory circuit of FIG. 1, memory cells 47 and 48 control the transistor pairs 45 and 46 by virtue of the fact that the floating nodes $21_1$ and $21_2$ of the respective memory cells are coupled to the gates of the mixed pairs of PMOS and NMOS transistors 45 and 46, respectively. Since the NMOS transistors are turned on by a positive gate voltage, transistor N5 is in an ON state when the floating node $21_1$ of cell 47 has a positive voltage. Similarly, because the PMOS transistors N5 and N6 are turned on by applying a negative voltage to their nodes, PMOS transistor P3 is in an ON state when the floating node $21_1$ of cell 48 has a negative voltage.

The interrelationships of the above-discussed elements is summarized in the first and fourth rows of Table 1, below.

TABLE 1

| Memory Cells | Floating Node State | Transistor Pair 45 | | | Transistor Pair 46 | | |
|---|---|---|---|---|---|---|---|
| | | P3 | N5 | $n_1$ | P4 | N6 | $n_2$ |
| 47 | $21_1$-Pos. | | ON | Gnd | OFF | | Floating |
| 48 | $21_2$-Neg. | ON | | | | OFF | |
| 47 | Failed | | OFF | Gnd | OFF | | Floating |
| 48 | $21_2$-Neg. | ON | | | | OFF | |
| 47 | $21_1$-Pos. | | ON | Gnd | OFF | | Floating |
| 48 | Failed | OFF | | | | OFF | |
| 47 | $21_1$-Neg. | | OFF | Floating | ON | | Gnd |
| 48 | $21_2$-Pos. | OFF | | | | ON | |

TABLE 1-continued

| Memory Cells | Floating Node State | Transistor Pair 45 | | | Transistor Pair 46 | | |
|---|---|---|---|---|---|---|---|
| | | P3 | N5 | $n_1$ | P4 | N6 | $n_2$ |
| 47 | Failed | | OFF | Floating | OFF | | Gnd |
| 48 | $21_2$-Pos. | OFF | | | | ON | |
| 47 | $21_1$-Neg. | | OFF | Floating | ON | | Gnd |
| 48 | Failed | OFF | | | | OFF | |

From Table 1, it can be understood that, if one of the memory cells 47 or 48 fails, the other acts as a backup. For example, if cell 47 fails because of rupture of the tunnel oxide between nodes $22_1$ and $22_2$, NMOS transistor N5 and PMOS transistor P4 will each receive a node bias voltage of 0 volts and will, therefore, assume an OFF state. Under that condition, the states of nodes n1 and n2 will remain the same. Thus, instead of two transistors being in an ON state and two transistors being in an OFF state, three transistors will be OFF while one transistor is ON.

The second line of Table 1 summarizes the situation when memory cell 47 fails while memory cell 48 stores a negative voltage. Since the voltage of the floating node $21_1$ is 0 volts in that situation, transistor N5 of the transistor pair 45 will be off, and transistor P4 of transistor pair 46 will also be off. Since memory cell 48 stores a negative voltage, transistor N6 will be off, causing transistor pair 46 to be off and node $n_2$ to be floating. However, transistor P3 will be on, causing node $n_1$ to be pulled to ground. Thus, the memory location will still be operable despite the failure of one of the memory cells.

Operation of the circuit of FIG. 1 can now be explained for a situation where the circuit experiences a power loss characterized by the power gradually diminishing. It should be understood that detection circuitry (not shown) is provided to detect the power drop and to control the voltage sources $V_{pp}$ in circuit 43 to bring the voltage sources to a high level. Once the voltage levels of sources $V_{pp}$ are raised, the information appearing at Q and $\overline{Q}$ are voltage level shifted by circuit 43 to a high state and written into the non-volatile memory cells 47 and 48. If the power to the system subsequently drops to a very low level, the information stored in circuit 42 will be lost, but the same information will be preserved in the non-volatile memory cells 47 and 48 for an extended period while the power is down. Thereafter, when system power is brought back up, the RECALL signals can be activated to turn on transistors 44 and 44', causing the information at nodes $n_1$ or $n_2$ to be written into SRAM circuit 42.

Thus, a RECALL command signal actuates transistors 44 and 44' to allow the contents of the non-volatile memory to be written into the SRAM. If the transistors are of the NMOS type, the RECALL signal is a positive high signal. If the transistors are of the PMOS type, the RECALL signal would be a negative signal. Activation of the RECALL transistors 44 and 44' effectively creates a short, thereby connecting the twin pairs of mixed transistors 45 and 46 to the data lines Q and $\overline{Q}$, respectively.

As discussed above, as long as one of the memory cells 47 or 48 is operable, one of the transistors in twin mixed pairs 45 and 46 will be ON of the nodes $n_1$ or $n_2$ will be at ground, while the other node is left in a floating state.

When the power comes up on a SRAM, absent any interaction with other circuitry, the data lines Q and Q would assume arbitrary values of 1 and 0, or 0 and 1, respectively. Therefore, it is necessary to introduce an asymmetry to force SRAM to assume the desired state. The non-volatile portion of the circuit introduces the asymmetry at nodes $n_1$ and $n_2$. Since one of the nodes is at ground, the corresponding data line is forced to a low state (upon activation of the RECALL transistors), thereby governing the binary state that the SRAM assumes. The floating node would not normally have any affect on the assumed state of the SRAM. Thus, the stored information is reinstated after a power down event by pulling down one side of the SRAM to ground.

At this juncture, it should be apparent that the above non-volatile memory may be useful in situations other than a power-down event. For instance, the information stored in the SRAM can be written into the non-volatile cells 47 and 48 at any time for backup purposes by simply bringing the voltage sources $V_{pp}$ to a high level. Also, the voltage sources could be retained at a high level, thereby writing the contents of the SRAM into the non-volatile memory each time information is written into the SRAM.

Although a specific embodiment of twin mixed-pairs of transistors and oppositely-oriented memory cells has been disclosed in the embodiment of FIG. 1, other configurations can be employed. For instance, although the circuit of FIG. 1 could operate with only one of the memory cells 47 or 48, it is preferred to have both cells. The two-cell configuration permits one of the cells to fail without causing the memory location to fail.

As another example of an alternative embodiment of the non-volatile memory circuit 42 of FIG. 1, more than two non-volatile memory cells can be connected in parallel to further assure information retention. In this embodiment, each additional memory cell includes a transistor which is added in parallel to transistor 45 and a transistor of opposite type which is added in parallel to transistor 46. The specific transistor type and circuit position of the additional transistors would be determined by the relative orientation of the memory cell to which they are connected.

FIG. 2 shows an example of a double polysilicon MOSFET memory cell 9 for use in the circuit of FIG. 1. Cell 9 is comprised of three electrodes 11, 12 and 13 that are electrically isolated from each other by oxide film layers. The first electrode 11 usually is called a floating node because it is completely encapsulated in an oxide insulating layer. The second electrode 12 is usually called a tunneling node, and the third electrode 13 is usually called a coupling node. Because of capacitive coupling between the three nodes, the combination can be modeled as two capacitors connected in series as shown in FIG. 2A.

In operation of the MOSFET memory cell 9 of FIG. 2, tunneling node 12 and coupling node 13 control the charge and discharge of the majority charge carriers (e.g., electrons in the disclosed embodiment) to floating node 11. When a high potential is established across the tunneling and coupling nodes, a tunneling current flows through oxide layer 15 at the region of overlap between tunneling node 12 and floating node 11. As tunneling current flows, the majority charge carriers are injected into floating node 11, thus writing data into the cell. Cell 9 can be described as being a non-volatile memory cell, since the charge on the cell is not altered when the potential across it is removed.

To erase the contents of memory cell 9 of FIG. 2, the potentials across tunneling node 12 and coupling node 13 are adjusted such that the potential of floating node 11 is driven sufficiently low that it emits electrons and, thereby, "erases" the data contents of the cell. Thus, data can be written into and erased from memory cell 9 by controlling tunneling node 12 and coupling node 13, thereby controlling floating node 11.

Accordingly, the present invention should not be construed as being limited to the particular embodiments discussed. Instead, the above-described embodiments should be regarded only as illustrative, and it should be appreciated that workers skilled in the art may make variations in those embodiments without departing from the spirit or scope of the present invention as defined by the following claims.

What is claimed is:

1. A non-volatile semiconductor memory system comprising:

a volatile memory circuit for storing binary information in static form;

voltage level shifter means for elevating the logic level of the stored binary information, the voltage level shifter means being connected in parallel to the volatile memory circuit;

a non-volatile storage means for storing said binary information, the information content of the non-volatile storage means being controlled by the elevated logic levels; and access means for providing access between said non-volatile storage means and said volatile memory circuit, wherein the content of said volatile memory circuit is alterable according to the contents of said non-volatile storage means.

2. A non-volatile semiconductor memory system according to claim 1, wherein:

the non-volatile storage means includes two floating node MOSFET memory cells that are connected in parallel in reverse orientation for storing complimentary information.

3. A non-volatile semiconductor memory system according to claim 2, wherein:

said floating node MOSFET memory cells are single polysilicon layer devices.

4. A non-volatile semiconductor memory system according to claim 3, wherein:

said single polysilicon memory cells include a floating polysilicon node, a tunnel node for supplying a tunnel current to and inducing a potential in said floating node, and a coupling node for inducing a potential on said floating node.

5. A non-volatile semiconductor memory system comprising:

volatile memory circuit for storing binary information in static form;

voltage level shifter means for elevating the logic level of the stored binary information, the voltage level shifter means being connected in parallel with the volatile memory circuit;

a non-volatile storage means, including two floating node MOSFET memory cells connected in parallel in reverse orientation for storing the binary information in complimentary states, the information content of two floating node MOSFET memory cells being controlled by the elevated logic levels; and access means, including twin mixed parallel coupled pairs of PMOS transistors and NMOS transistors, for providing the access between the non-volatile storage means and the volatile memory circuit so that the contents of the volatile memory circuit is alterable in accordance with the contents of the non-volatile storage means.

6. A non-volatile semiconductor memory system comprising:

at least two non-volatile memory cells connected in parallel with opposing orientations, each cell having a node electrode; and two access transistors, one of the NMOS type and one of a PMOS type, the node of each of which is connected to the node electrode of one of the non-volatile memory cells such that each cell is connected to form parallel-connected transistors pairs of mixed transistor types.

7. A non-volatile semiconductor memory system comprising:

at least two non-volatile memory cells connected in parallel, each cell having a node electrode and each cell having an orientation similar to the other cell; and two access transistors, one of the NMOS type and one of a PMOS type, the node of each of which is connected to the node electrode of one of the non-volatile memory cells such that each cell is connected to a mixed pair of transistors to form parallel connected transistor pairs of the same transistor type.

8. A non-volatile memory system according to claim 7 further comprising:

voltage level shifter means connected in parallel to the non-volatile memory cells for electrically writing information into said cells.

9. A non-volatile memory system according to claim 6, further comprising:

a voltage level shifter means connected in parallel to the non-volatile memory cells for electrically writing information into said cells.

* * * * *